United States Patent [19]
Bruel et al.

[11] Patent Number: 5,661,333
[45] Date of Patent: Aug. 26, 1997

[54] SUBSTRATE FOR INTEGRATED COMPONENTS COMPRISING A THIN FILM AND AN INTERMEDIATE FILM

[75] Inventors: Michel Bruel, Veurey; Béatrice Biasse, Uriage, both of France

[73] Assignee: Commissariat a L'Energie Atomique, Paris, France

[21] Appl. No.: 377,835

[22] Filed: Jan. 25, 1995

[30] Foreign Application Priority Data

Jan. 26, 1994 [FR] France ................... 94 00834

[51] Int. Cl.⁶ ..................... H01L 29/06; H01L 23/34
[52] U.S. Cl. ............... 257/618; 257/619; 257/622; 257/714; 257/715
[58] Field of Search ................... 257/618, 619, 257/622, 714, 715

[56] References Cited

U.S. PATENT DOCUMENTS 4,060,823  11/1977  Howorth et al. ................... 257/619

FOREIGN PATENT DOCUMENTS

| 533 551 | 3/1993 | European Pat. Off. . | |
| 1348742 | 12/1963 | France | 257/618 |
| 2 266 304 | 10/1975 | France . | |
| 54-66777 | 5/1979 | Japan | 257/618 |
| WO93/11559 | 6/1993 | WIPO . | |

OTHER PUBLICATIONS

"Laser Machining and Anisotropic Etching of <111> Silicon for Applications in Microsystems", M. Alavi, et al., pp. 227–231.

Primary Examiner—Mahshid D. Saadat
Assistant Examiner—Valencia Martin Wallace
Attorney, Agent, or Firm—Oblon, Spivak, McClelland, Maier & Neustadt, P.C.

[57]  ABSTRACT

A substrate for integrated components including a support structure and a thin non-conductive film. An intermediate film is placed between the support structure and the thin non-conductive film. The intermediate film is a sacrificial film which may be removed chemically. By doing so, the thin non-conductive film may be liberated from the support structure. The intermediate film is traversed by channels which carry the chemicals for removing the sacrificial film. The channels may form a grid on the surface of the intermediate film.

9 Claims, 2 Drawing Sheets 5,661,333

SUBSTRATE FOR INTEGRATED COMPONENTS COMPRISING A THIN FILM AND AN INTERMEDIATE FILM

FIELD OF THE INVENTION

The invention concerns a substrate for integrated components comprising a thin film and a method for embodying said substrate.

Integrated components are understood to be electronic circuits (such as transistors, memories, microprocessors), optical or optoelectronic components (such as mirrors, electroluminescent diodes, electro-optical or electro-acoustic modulators) or sensors (such as pression or temperature sensors).

More generally, a component is understood to be all the elements able to be embodied on a thin film.

The invention is more particularly applicable to the field of microelectronics and the production of integrated circuits on thin films.

BACKGROUND OF THE INVENTION

One of the roles of substrates in microelectronics is to establish a mechanical support for the components embodied on their surface. This support role is particularly important when actually embodying the components. However, as soon as the components are embodied, the substrate may in certain cases take up a large amount of space.

Also, for a certain number of applications, an attempt has been made to obtain the components on thin-film substrates. As the thickness of these thin substrates does not generally provide them with sufficient rigidity in order to resist mechanical processings and stresses when producing the components, it is essential that a substrate be rendered thicker at the time it is produced.

So as to obtain finally the substrates on a thin film, it is then possible to proceed with an abrasion of the substrate. Another solution consists of splitting the substrate so as to detach from it a thin surface film comprising the components.

Splitting is understood to be any separation, preferably along a plane, of the substrate into two portions.

However, these splitting or abrasion operations require that the component undergo mechanical and/or heat stresses possibly damaging them irreparably.

One aim of the present invention is to provide a solution able to reconcile the need for a sufficiently rigid and resistant substrate for the production of the components and the requirement for obtaining thin-film substrates, especially to integrate them in more complex structures.

SUMMARY OF THE INVENTION

To this effect, the invention more particularly concerns a substrate for integrated components comprising a support structure and a thin nonconductive film for embodying the components, wherein it further comprises an intermediate film made of a chemically attackable material which connects the support structure to the thin film, the intermediate film being traversed by at least one chemical attack channel.

A nonconductive film is understood to be a single film made of a semiconductive material or a nonconducting material, as well as a set of sub-films, at least one of said sub-films being made of a semiconductive or nonconducting material.

The support structure is preferably much thicker than the thin film.

This structure provides the substrate with its mechanical resistance to treatments and avoids any warping or tearing the superficial thin film in or on which the components are embodied.

One of the roles of the intermediate film is the firmly keep the thin film on the substrate during the formation of the integrated components and thus prevent it from tearing.

The main role of the intermediate film is, however, to enable the thin film and the substrate to be separated.

As the intermediate film is made of a chemically attackable material, after the embodiment of the integrated components, it is possible to eliminate this chemically intermediate film and thus free the thin film. During this operation, the intermediate film is attacked chemically. As a result, the integrated components do not undergo any mechancial stress or heat stress.

If the nature of the materials used for embodying the integrated components so require, it is possible to provide a protective film to protect them during the chemical attack.

According to one important characteristic of the invention, the intermediate film is traversed by one or several channels. These channels are able to extensively irrigate in depth the intermediate film during a chemical bath. The chemical substance for attack of the intermediate film may therefore circulate in this film so as to eliminate it, not solely on the periphery, but also at depth as fully as possible. In fact, it is extremely important to completely free the thin film so as to avoid damaging it when separating it from the substrate.

The embodiment of channels in the intermediate film allows for a much faster attack and homogeneous with the latter. These channels may be embodied at any level in the thickness of the intermediate film but, for rendering embodiment easier, are embodied from the surface of this film. Moreover, the depth of the channels may reach the thickness of the intermediate film.

According to one characteristic of the invention, the intermediate film is traversed by an orthogonal channel network able to improve distribution the chemical attack of the intermediate film over the entire surface which connects it to the thin film.

According to one variant, the film may be also be traversed by a channel folded into a serpentine or spiral shape.

The network of channels, or the line of the channel in the case of a single channel, needs to be sufficiently dense to allow for a fast uniformly distributed chemical attack, but the channels must not be too wide or have too large a section which would adversely affect the support function of the intermediate film.

So as to ensure that the intermediate film does not undergo the chemical treatments required for embodying the integrated components, it is preferable that the channel(s) is/are closed by a border of the film. The border, which laterally seals off the ends of the channels, is embodied sufficiently thick so as to resist the chemical treatments. As the channels do not open, the intermediate film may possibly be disturbed at the periphery by the production treatments of the integrated components.

Prior to chemical attack, the border is eliminated so as to open the channels. This opening of the channels outwardly can be effected without disturbing the integrated components by attacking at least one portion of the circumference of the intermediate film and thus the border by means of dry etching. Another solution consists of attacking the film in the zones corresponding to the cutting lines of the integrated components.

According to the invention, the method for producing the substrate comprises the following successive stages:

a) forming on a support structure an intermediate film of a chemically attackable material and having one approximately flat free face, b) etching of the intermediate film via the free face so as to form at least one chemical attack channel traversing said film and thus retaining in the film one border for closing the channel(s), c) applying on the free face of the intermediate film a thin nonconductive film for the formation of the integrated components and sealing the channel on said face, said thin film being able to be detached from the support structure by the chemical attack of the intermediate film.

So as to obtain integrated components on a thin substrate, the method is continued by the following stages:

d) formation of integrated components on the thin film, e) opening of the chemical attack channel(s), f) elimination of the intermediate film by chemical attack through the channel(s) so as to detatch the thin film from the support structure.

The etching of the channel(s) may advantageously take place either according to conventional techniques, such as dry or humid etching through a suitable mask, or by an etching method including a laser treatment followed by an anisotropic chemical attack. The latter method is described in the document entitled "Laser Machining and Anisotropic Etching of <III> Silicon for Applications in Microsystems" by M. Alavi and al. in "Micro System Technologies 92", 3rd International Conference on Micro Electro, Opto, Mechanic Systems and Components, Berlin, Oct. 21–23, 1992, vde-verlag gmbh—Herbery Reichl, Berlin Offenbach.

This technique is based on the difference of the attack speed of crystallographic planes <III> with respect to other crystallographic planes.

According to this technique, the crystallographic planes <III> are destroyed by the local melting of the film to be etched by means of a laser beam. Secondly, a chemical treatment eliminates the zones attacked by the laser beam, the planes <III> not destroyed then serving as a "stop" film". By means of this technique, it is possible to obtain channels whose width, depth and location can be controlled with extreme accuracy.

When the thin film is applied to the free face of the intermediate film, it covers the channel(s). The channels are thus isolated from the outside.

Advantageously, this application may be carried out under a controlled atmosphere so as to imprison on the channels a gas pressure compatible with the thermal treatments used for producing the components.

So as to apply a thin film on the intermediate film, or more specifically, so as to obtain the thin film itself, several solutions are possible.

For example, it is possible to apply on the intermediate film a second substrate or a thick film and then abrase this film so as to obtain the thin film.

The mechanical or thermal stresses of this abrasion are generally not damaging, as at this stage the integrated components are still not formed.

However, a splitting method is preferably used to render implementation easier and is best adapted to the present invention.

According to this method, a splittable structure is applied on the intermediate film at the level of a splitting plane. This splitting plane may be established by implementing rare gas or hydrogen ions in the structure from a flat face. This implentation generates gaseous microbubbles at the level of this plane which thus in the splittable structure delimits firstly a massive portion, and secondly the future thin film. One embodiment of a splittable structure is shown in the patent application EP-A-0 533 551. The splittable structure is mounted on the intermediate film by placing the latter in contact with the portion of the structure constituting the future thin film. The splittable structure is rendered integral with the intermediate film, for example, by inter-atomic links. When the applying operation has been completed, a thermal treatment causes splitting along the plane defined by the microbubbles.

DETAILED DESCRIPTION OF THE PREFERRED EMBODIMENTS

Figure 1:
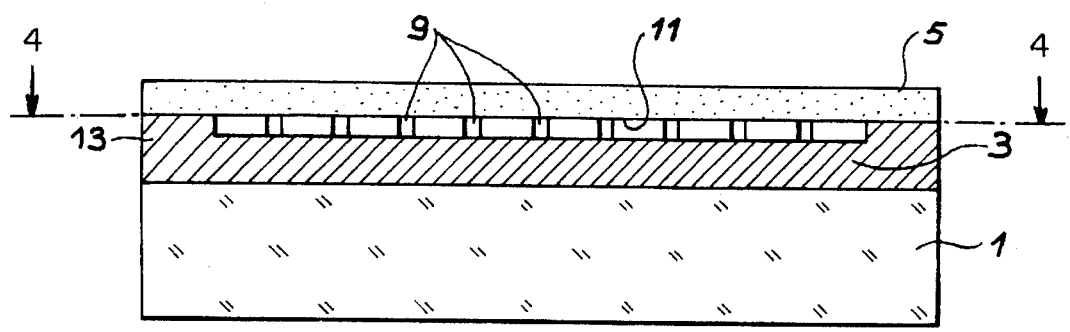
FIG. 1 is a diagrammatic diametral section A—A along a channel of a cylindrical substrate conforming to the invention.

The substrate shown on FIG. 1 is generally cylindrical and comprises a mechanical support structure 1, such as a silicon or glass plate, an intermediate film 3 made of a chemically attackable material and a thin film 5.

The film 5 itself constitutes a "substrate" for embodying integrated components and may also be formed by a single film made of a semiconductive or nonconducting material, as well as a set of sub-films, at least one of said sub-films being made of a semiconductive or nonconducting material. This is the case in the example described where the film 5 is made of monocrystalline silicon. Its thickness is about 1 μm, for example.

It is possible to distinguish in the film 3 a central region 7 traversed by channels 9. The channels flush with an upper face 11 of the film 3 are distributed uniformly in the region 7.

The region 7 is surrounded by a circular border 13 which laterally closes the channels 9.

The section of the channels and the thickness of the film 3 on the figures are shown enlarged with respect to the width of the border 13.

The border 13 is sufficiently wide to remain insensitive to the treatments accompanying the formation of integrated components in the thin film 5. By way of example, the border 13 has a width of 4 mm, whereas the film 3 has a thickness of about 10 μm. The channels have a width ranging of between 2 and 50 μm.

As regards the face 11, the channels 9 are sealed off by applying them against this face of the thin film 5.

Figure 2:
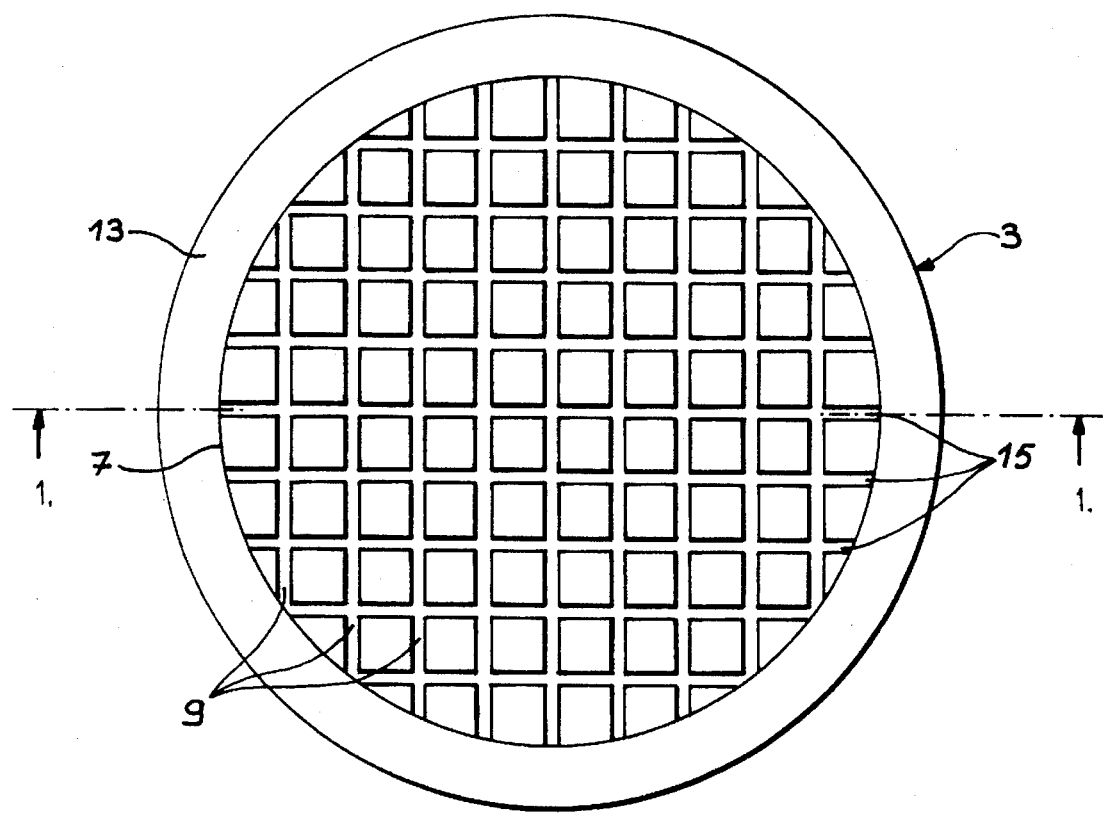
FIG. 2 is a diagrammatric section B—B of a substrate along a face of an intermediate film.

The face 11 and the distribution of the channels 9 appears more clearly on FIG. 2 which is a section B—B parallel this face.

In particular, this figure shows that the ends 15 of the channels 9 are sealed off by the border 13 which delimits the central region 7.

The channels 9 form an orthogonal network.

By way of example, the pitch of this network is 100 μm for channels 9 having a width of 10 μm.

Figure 3:
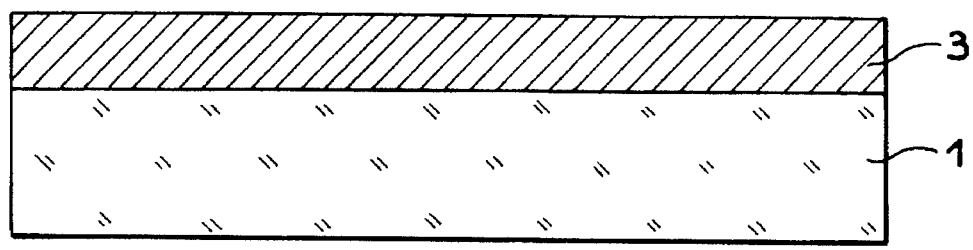
FIGS. 3 to 5 are diagramatic diametral sections A—A illustrating a method for producing the substrate of the invention.
Figure 4:
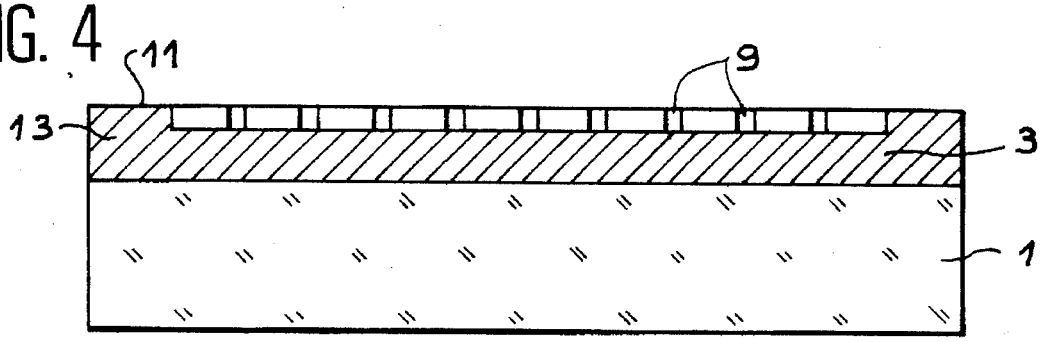
Figure 5:
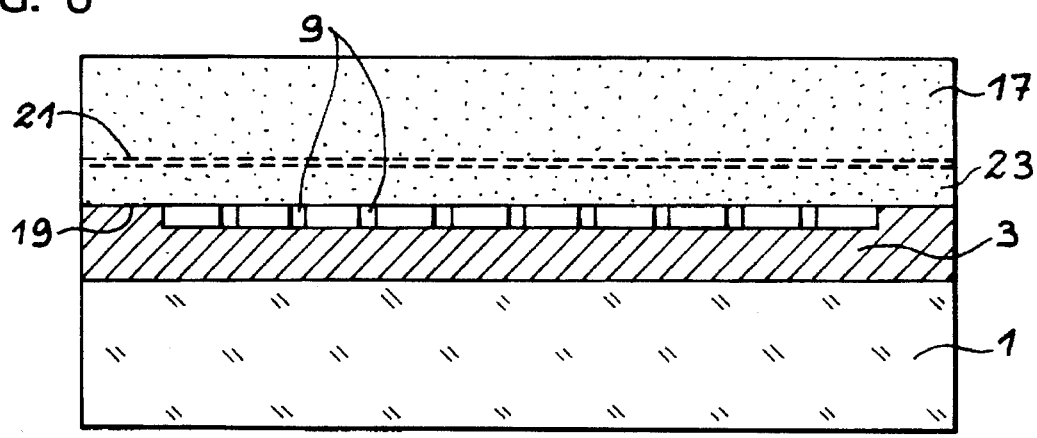

FIGS. 3 to 5 render it easier to understand the stages for producing a substrate according to one characteristic of the invention.

In one first stage corresponding to FIG. 3, a chemically attackable film 3 is formed on a structure 1 constituting a first substrate. For example, a film of silicon oxide with a thickness of 10 μm is laid down. This deposit may be effected by chemical vapor phase depositing.

The film 3 is then etched in a central region 7 so as to form the channels 9. The etching may take place by either dry etching or humid etching through a suitable mask or according to a known technique combining a laser beam treatment and a chemical treatment.

The next stage consists of mounting on the face 11 of the film 3 a second structure 17, such as a splittable structure. By way of example, this concerns a monocrystalline silicon block having an approximately flat face 19. A film 21 of gaseous microbubbles has previously been established by being implanted in the structure 17.

The film 21, approximately parallel to the face 19, constitutes a splitting plane and delimits in the structure 17 a superficial portion 23 which constitutes the future thin film.

The applying operation is carried out by rendering integral, for example by inter-atomic links, the structure 17 on the film 3 via its superficial portion 23. A unit shown on FIG. 5 is then obtained.

A stage for splitting the structure 17 makes it possible to detach from it the portion 23 which becomes the thin film 5 of the substrate of the invention, as shown on FIG. 1. The thickness of this film is about one micrometer.

The substrate is now ready for embodying the integrated components.

The components are embodied in or on the thin film according to known techniques.

A protective film (not shown) made of a material, such as silicon nitride, may be provided so as to protect the components.

When the integrated components are formed and protected, it is possible to separate the thin film 5 from the support structure 1.

Figure 6:
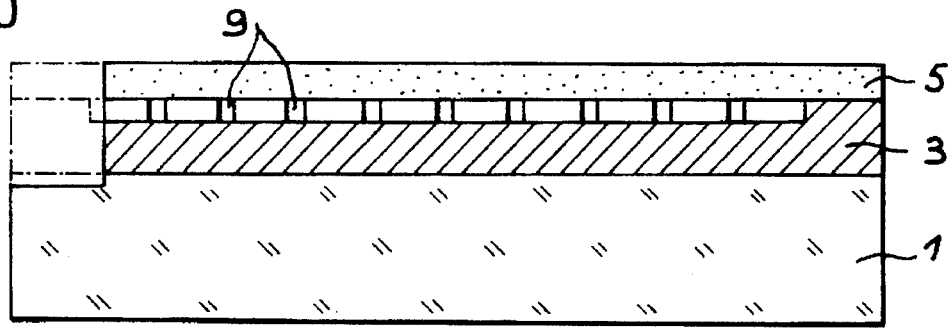
FIG. 6 illustrates a section A—A of a substrate conforming to the invention and prepared for separating a superficial film.

As shown on FIG. 6, at least the border 13 surrounding the region 7 of the substrate is eliminated. The channels 9 are thus opened outwardly.

In this embodiment example, so as to eliminate the border 13, the thin film is firstly attacked by etching. This etching may take place by dry means on the circumference of the substrate and in a region where there are no integrated components. Thus, this etching does not disturb the components.

In the uncovered zones of the film 5, the intermediate film is then etched so as to eliminate at least one portion of the border and open the channels.

Following this etching, the substrate is subjected to a chemical bath which selectively attacks the volume of the film 3 via the channels 9. In the present case where the film 3 is made of silicon oxide, a bath of fluorhydric acid (FH) is used.

The kinetics of the chemical attack may be controlled by the temperature of the bath and by a possible agitation movement of said bath.

The integrated components are protected during this attack by the film of silicon nitride (not shown).

As soon as the film 3 is etched, at least entirely along a plane parallel to the films, the thin film 5 detaches itself from the structure 1.

Thus, by means of the invention, a sufficiently rigid resistant substrate is available for the formation of integrated components and makes it possible to obtain a thin film without damaging the components.

What is claimed is:

1. Substrate for integrated components comprising a support structure and a thin nonconductive film for embodying the integrated components disposed on said structure, wherein the substrate further comprises an intermediate sacrificial film made of a material which may be chemically removed between the support structure and the thin film, so as to liberate the thin nonconductive film, the intermediate sacrificial film being traversed by at least one chemical attack channel forming a groove.

2. Substrate according to claim 1, wherein the chemical attack channel is closed by a border of the intermediate film.

3. Substrate according to claim 1, wherein the intermediate film is traversed by channels forming an orthogonal network.

4. Substrate according to claim 3, wherein the network has a pitch of 100 μm and the channels a width of 10 μm.

5. Substrate according to claim 1, wherein the thin film is made of a semiconductive or nonconducting material.

6. Substrate according to claim 1, wherein the thin film is a film of monocrystalline silicon with a thickness of about 1 μm.

7. Substrate according to claim 1, wherein the thin film is formed of a set of sub-films, at least one of said sub-films being made of a semiconductive or nonconducting material.

8. Substrate according to claim 1, wherein the intermediate film is a film of silicon oxide with a thickness of about 10 μm.

9. Substrate according to claim 2, wherein the border has a width of about 4 mm.

* * * * *